(12) United States Patent
Chu et al.

(10) Patent No.: US 11,575,047 B2
(45) Date of Patent: Feb. 7, 2023

(54) SEMICONDUCTOR DEVICE ACTIVE REGION PROFILE AND METHOD OF FORMING THE SAME

(71) Applicant: Taiwan Semiconductor Manufacturing Co., Ltd., Hsinchu (TW)

(72) Inventors: Feng-Ching Chu, Hsinchu (TW); Wei-Yang Lee, Hsinchu (TW); Chia-Pin Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/318,362

(22) Filed: May 12, 2021

(65) Prior Publication Data

US 2022/0367720 A1 Nov. 17, 2022

(51) Int. Cl.
*H01L 29/66* (2006.01)
*H01L 29/423* (2006.01)
*H01L 29/786* (2006.01)
*H01L 29/06* (2006.01)
*H01L 21/762* (2006.01)
*H01L 29/78* (2006.01)
(Continued)

(52) U.S. Cl.
CPC .... *H01L 29/7856* (2013.01); *H01L 21/32134* (2013.01); *H01L 21/76224* (2013.01); *H01L 29/0673* (2013.01); *H01L 29/1037* (2013.01); *H01L 29/42392* (2013.01); *H01L 29/66545* (2013.01); *H01L 29/66818* (2013.01); *H01L 29/78618* (2013.01); *H01L 29/78696* (2013.01)

(58) Field of Classification Search
CPC .......... H01L 29/7856; H01L 21/32134; H01L 29/0673; H01L 29/1037; H01L 29/42392; H01L 29/66545; H01L 29/66818; H01L 29/78618; H01L 29/78696
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Earl N Taylor
(74) *Attorney, Agent, or Firm* — Haynes and Boone, LLP

(57) ABSTRACT

Semiconductor device and the manufacturing method thereof are disclosed. An exemplary method of manufacture comprises receiving a substrate including a semiconductor material stack formed thereon, wherein the semiconductor material stack includes a first semiconductor layer of a first semiconductor material and second semiconductor layer of a second semiconductor material that is different than the first semiconductor material. Patterning the semiconductor material stack to form a trench. The patterning includes performing a first etch process with a first etchant for a first duration and then performing a second etch process with a second etchant for a second duration, where the second etchant is different from the first etchant and the second duration is greater than the first duration. The first etch process and the second etch process are repeated a number of times. Then epitaxially growing a third semiconductor layer of the first semiconductor material on a sidewall of the trench.

20 Claims, 15 Drawing Sheets

(51) Int. Cl.
*H01L 29/10* (2006.01)
*H01L 21/3213* (2006.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,297,664 B2 * | 5/2019 | Xie ............... H01L 29/0673 |
| 11,239,335 B2 * | 2/2022 | Liaw ............. H01L 29/0653 |
| 2013/0285116 A1 | 10/2013 | Lochtefeld et al. |
| 2015/0243733 A1 * | 8/2015 | Yang ............. H01L 29/785 |
| | | 257/401 |
| 2017/0358646 A1 * | 12/2017 | Fung ........... H01L 29/42392 |
| 2018/0301531 A1 * | 10/2018 | Xie ............. H01L 21/02532 |
| 2019/0051729 A1 * | 2/2019 | Zhou ............. H01L 29/785 |
| 2019/0081155 A1 * | 3/2019 | Xie ............. H01L 29/42392 |
| 2021/0098627 A1 * | 4/2021 | Liaw ........... H01L 29/66545 |
| 2021/0125859 A1 * | 4/2021 | Lin ............. H01L 21/30655 |
| 2021/0202465 A1 * | 7/2021 | Wang ........... H01L 21/823814 |
| 2021/0296445 A1 * | 9/2021 | Lee .................. B82Y 10/00 |
| 2022/0037509 A1 * | 2/2022 | Huang ........... H01L 29/0673 |

\* cited by examiner

SEMICONDUCTOR DEVICE ACTIVE REGION PROFILE AND METHOD OF FORMING THE SAME

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, current source/drain etching techniques leave behind semiconductor residue which causes weak points in the source/drain region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
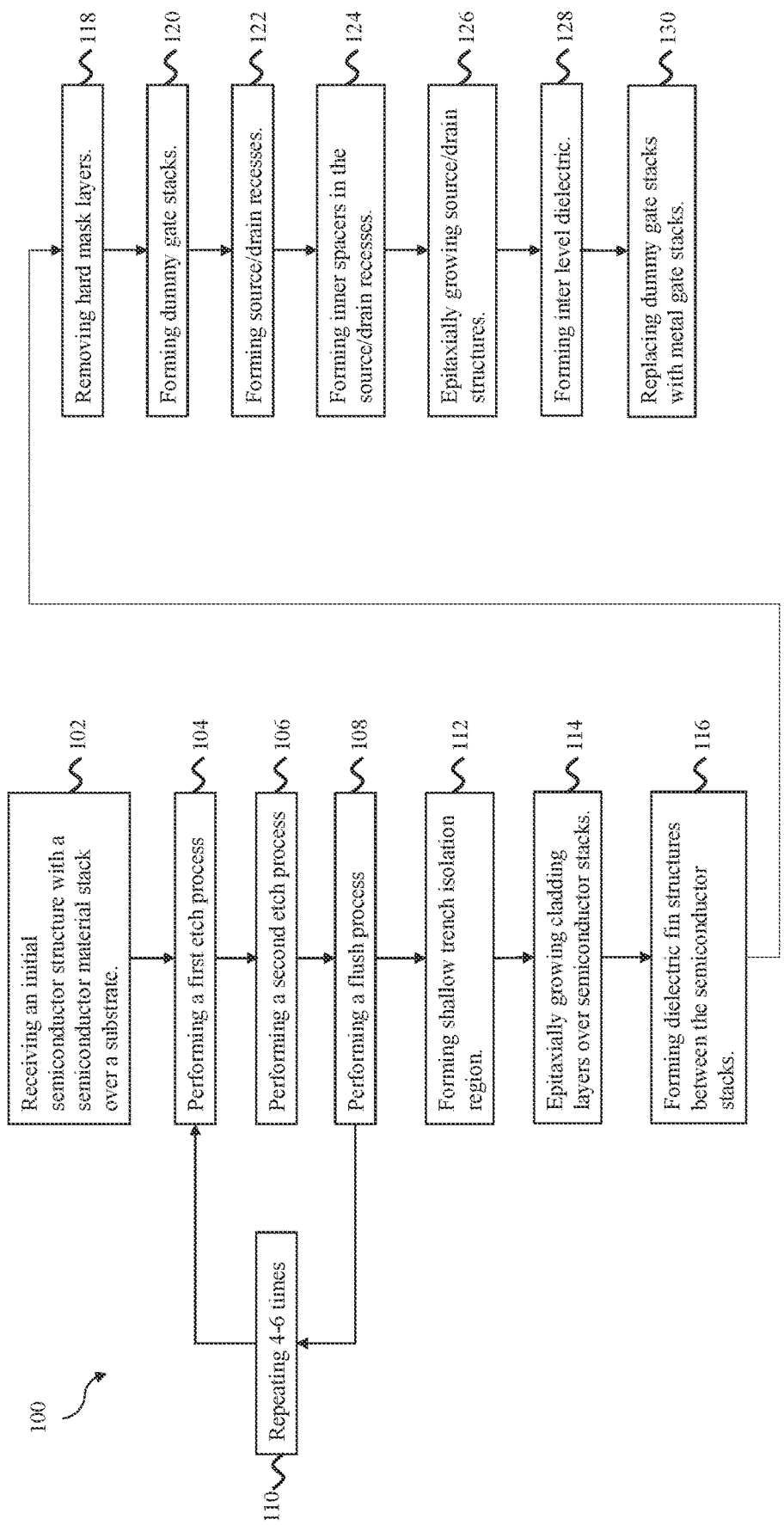
FIG. 1 illustrates a flowchart of an example method for making an example semiconductor device in accordance with some embodiments of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multigate transistors include those transistors whose gate structures are formed on at least two-sides of a channel region. These multi-gate devices may include a P-type metal-oxide semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nano sheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures which provide an improved active region profile to improve etching efficiency. The active region profile formed using methods described herein is a necking profile, being wider at the top than the bottom, as opposed to current profiles that are tapered, having a narrower top than the bottom. In various embodiments, the disclosed active region profile may allow for improved etching of a source/drain region. Because the top of the active region is wider than the bottom, the sidewalls of the source/drain regions are not partially blocked by any structures (e.g. dielectric fins) and are fully etched. Fully etching the sidewalls of the source/drain region mitigates the risks of leaving residue behind on the sidewalls after a recess etching process. For example, during a source/drain etching process, SiGe cladding residue may remain causing leak paths in the GAA structure as formed. In some embodiments, the etching techniques described below allow for better etch control than previously available using conventional techniques. Other embodiments and advantages will be evident to those skilled in the art upon reading the present disclosure.

Figure 2:
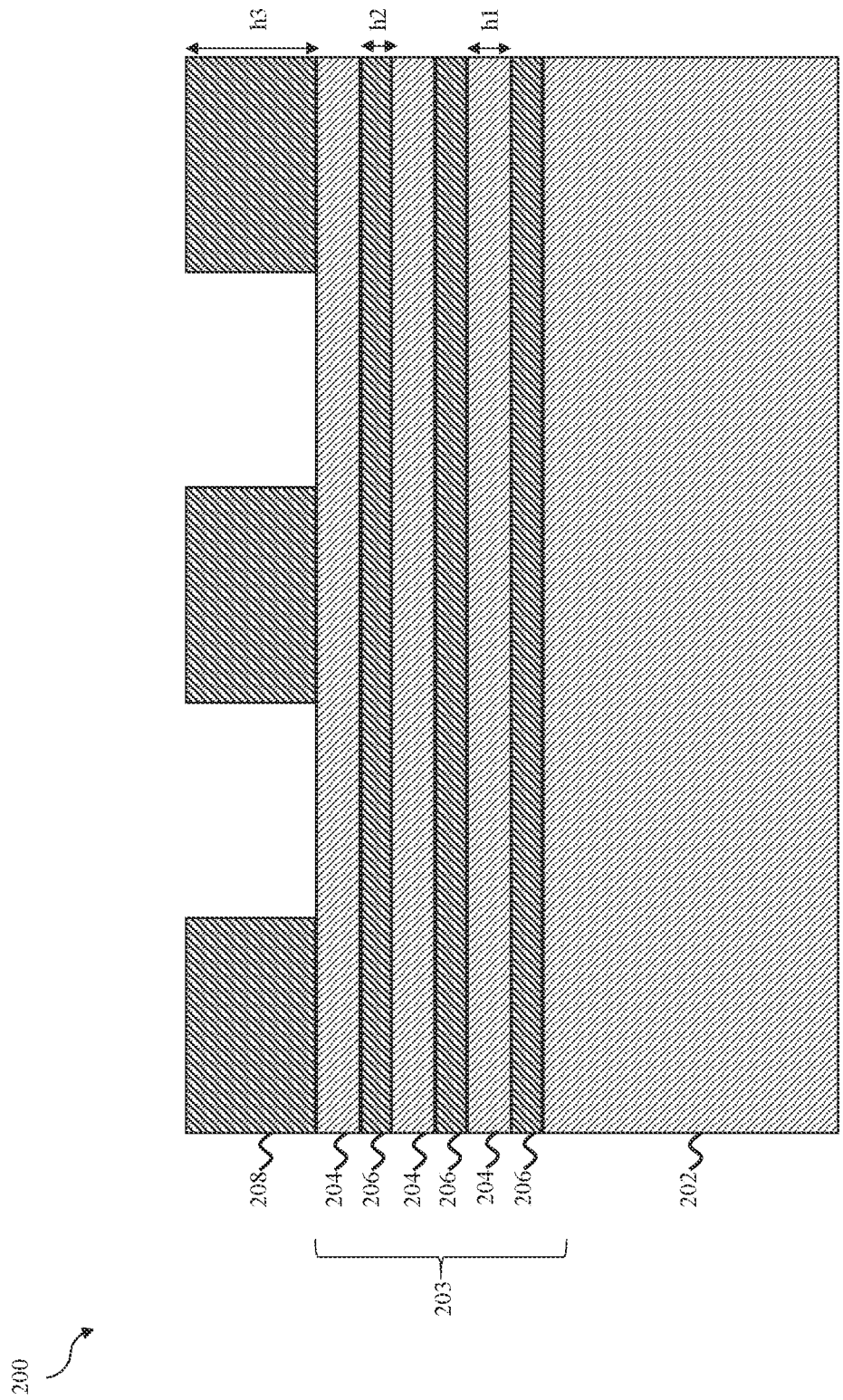
FIG. 2-15 illustrate cross-sectional views of the example semiconductor device in accordance with some embodiments of the present disclosure.

FIG. 1 illustrates a flow chart of a method 100 for making an example semiconductor device 200 (hereinafter, the device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate cross-sectional views of the device 200 during intermediate steps of method 100. In particular, FIG. 2 illustrates a cross-sectional view of the device 200 at an initial stage of the method 100. FIGS. 3-15 illustrate cross-sectional views of the device 200 during the various steps of method 100.

In some embodiments, the device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Referring to FIG. 2, at block 102 of method 100, an initial semiconductor structure of device 200 is received. As depicted in FIG. 2, the device 200 includes a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 also includes a semiconductor material stack 203. In the depicted embodiment, the semiconductor material stack 203 includes alternating semiconductor layers, such as semiconductor layers 204 including a first semiconductor material and semiconductor layers 206 including a second semiconductor material that is different from the first semiconductor material. The different semiconductor materials in the semiconductor layers 204 and 206 have different oxidation rates and/or different etch selectivity. In some embodiments, the first semiconductor material of the semiconductor layers 204 is the same material as the substrate 202. For example, the semiconductor layers 204 comprise silicon (Si, like the substrate 202), and the semiconductor layers 206 comprise silicon germanium (SiGe). In some embodiments, the semiconductor layers 206 may have a concentration of germanium (Ge) between about 20% Ge and about 30% Ge. In some embodiments, the semiconductor layers 206 may have a concentration of Ge between about 23% and about 24%. Thus, the semiconductor material stack 203 is arranged with alternating SiGe/Si/SiGe/Si/ . . . semiconductor layers from bottom to top. In some embodiments, the material of the top semiconductor layer may or may not be the same as the bottom semiconductor layer in the stack. For example, for a stack that comprises alternating SiGe and Si layers, the bottom semiconductor layer comprises SiGe, and the top semiconductor layer may comprise Si or SiGe. In the depicted embodiment, the bottom semiconductor layer comprises SiGe and the top semiconductor layer comprises Si. In some embodiments, the semiconductor layers 204 may be undoped or substantially dopant-free. In other words, no intentional doping is performed when forming the semiconductor layers 204. In some other embodiments, the semiconductor layers 204 may be doped with a p-type dopant or an n-type dopant. The number of the semiconductor layers 204 and 206 in the stack depends on the design of device 200. For example, the stack may comprise one to ten layers of semiconductor layers 204 or 206 each.

The semiconductor layers 204 have a height h1 as measured in a first direction, the first direction being perpendicular to the substrate surface (e.g. vertical). In some embodiments, the height h1 may be between about 7 nm and about 13 nm. In some embodiments, the height h1 may be between about 9 nm and about 11 nm. In some embodiments, the height of each semiconductor layer 204 may be larger or smaller than each other semiconductor layer 204. The semiconductor layers 206 have a height h2 as measured in the first direction (e.g. vertical). In some embodiments, the height h2 may be between about 5 nm and about 10 nm. In some embodiments, the height h2 may be between about 5.5 nm and about 7 nm.

In some embodiments a patterned hard mask layer is formed on top of the semiconductor layers 204 and 206 to define active regions and functioning as an etch mask during subsequent etchings. The hard mask may include one or more material layers. In the depicted embodiment, hard mask layer 208 is deposited after the deposition of the top semiconductor layer 204. The hard mask layer 208 may include any suitable dielectric material, such as semiconductor oxide (SiO), semiconductor nitride (SiN), and/or silicon carbonitride (SiCN). In the depicted embodiment, the hard mask layer 208 includes SiGe. The hard mask layer has a height h3 as measured in the first direction (e.g. vertical). In some embodiments, the height h3 may be between about 25 nm and about 35 nm. The hard mask layers 208 may be deposited over the semiconductor layers by CVD, physical vapor deposition (PVD), atomic layer deposition (ALD), other suitable deposition process, or combinations thereof. Subsequently, a photoresist and an etching process may be performed to the hard mask layer 208 to form a patterned hard mask as illustrated in FIG. 2.

Figure 3:
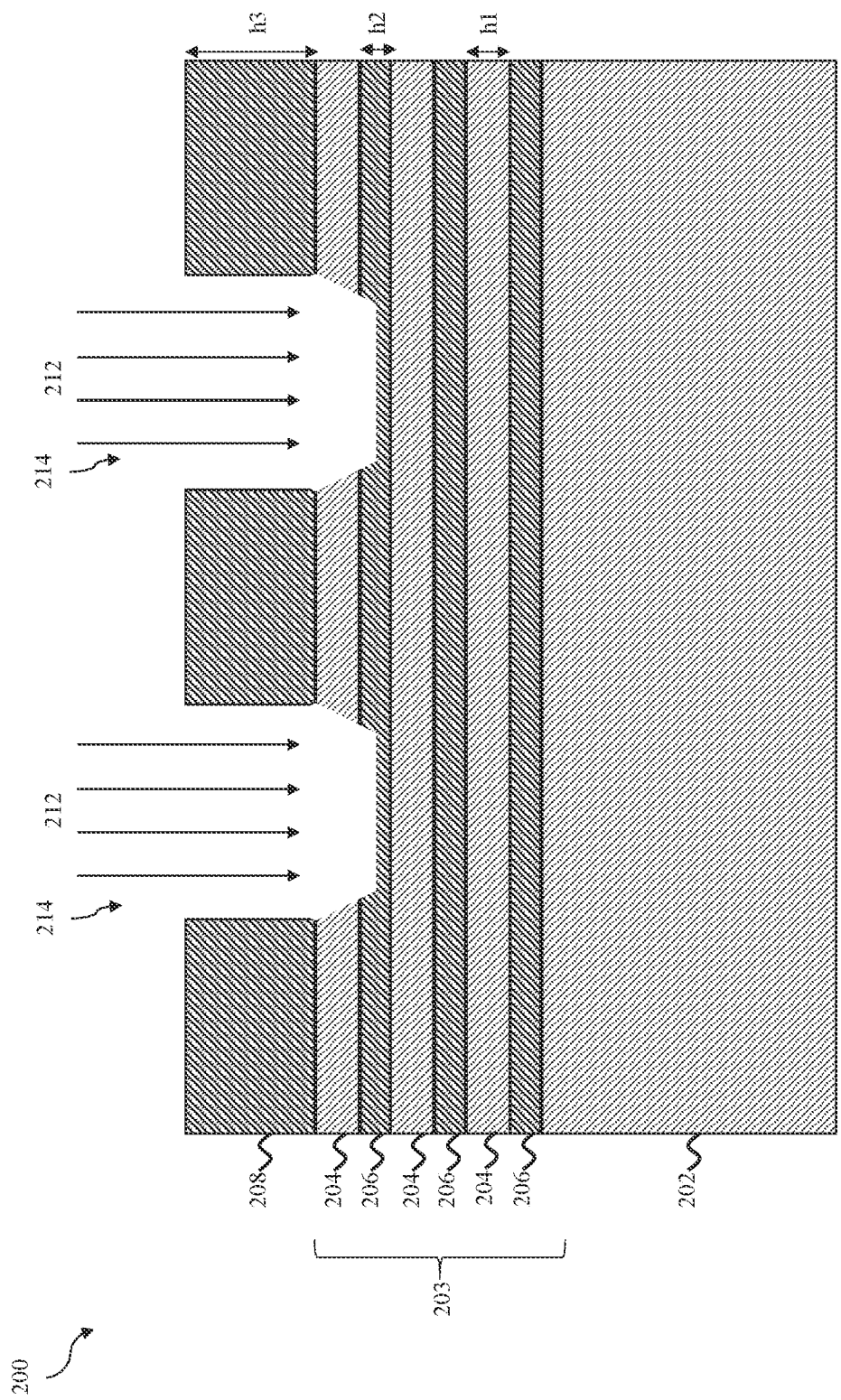

Referring to FIG. 3, at block 104 of method 100, a first etching process is performed on device 200. The first etching process 212 forms trenches 214 in semiconductor layers 204 and 206 of semiconductor material stack 203. The trenches 214 separate distinct semiconductor material stacks 203, or fins. For example, various factors including bias power and etchant are selected for the first etching process 212 that etches the materials of semiconductor layers 204 and 206 (e.g. silicon and silicon germanium) at a higher rate in a first direction than in a second direction. In some embodiments, the first direction is perpendicular to the substrate surface (e.g. vertical) and the second direction is parallel to the substrate surface (e.g. horizontal). In some embodiments, the first etching process 212 etches through a first semiconductor layer 204 and partially in a first semiconductor layer 206, just below the first semiconductor layer 204. In some embodiments, the first etching process 212 forms trenches 214 that have a non-uniform bottom portion. In the depicted embodiment, the first etching process 212 has a higher etch rate in the first direction than in the second direction.

In some embodiments, the first etching process 212 is a dry etching process. Various etching parameters can be tuned to achieve selective etching of semiconductor layers 204 and 206, such as etchant composition, etching temperature, etching solution concentration, etching time, etching pressure, source power, RF bias voltage, RF bias power, etchant flow rate, other suitable etching parameters, or combinations thereof. In some embodiments, the first etching process (such as an RIE process) utilizes a chlorine-containing gas (for example, $Cl_2$) to selectively etch semiconductor layers 204 and 206 in the first direction. In some embodiments the chlorine-containing gas flow may be about 100 ml/min. In some embodiments, the first etching process utilizes oxygen ($O_2$) with a flow rate of 30 ml/min, Hydrogen ($H_2$) with a flow rate of 10 ml/min, Helium (He) with a flow rate of 150 ml/min, Argon (Ar) with a flow rate of 50 ml/min, or nitrogen trifluoride ($NF_3$) with a flow rate of about 1 ml/min to about 8 ml/min. In some embodiments, the etching pressure is between about 3 mT to about 4 mT. The first etching process lasts for a first duration. In some embodiments, the first duration is between about 10 seconds and 13 seconds. In some embodiments, the source power is about 800 W. In some embodiments, the RF bias power is about 400 W and the RF frequency is about 500 Hz.

Figure 4:
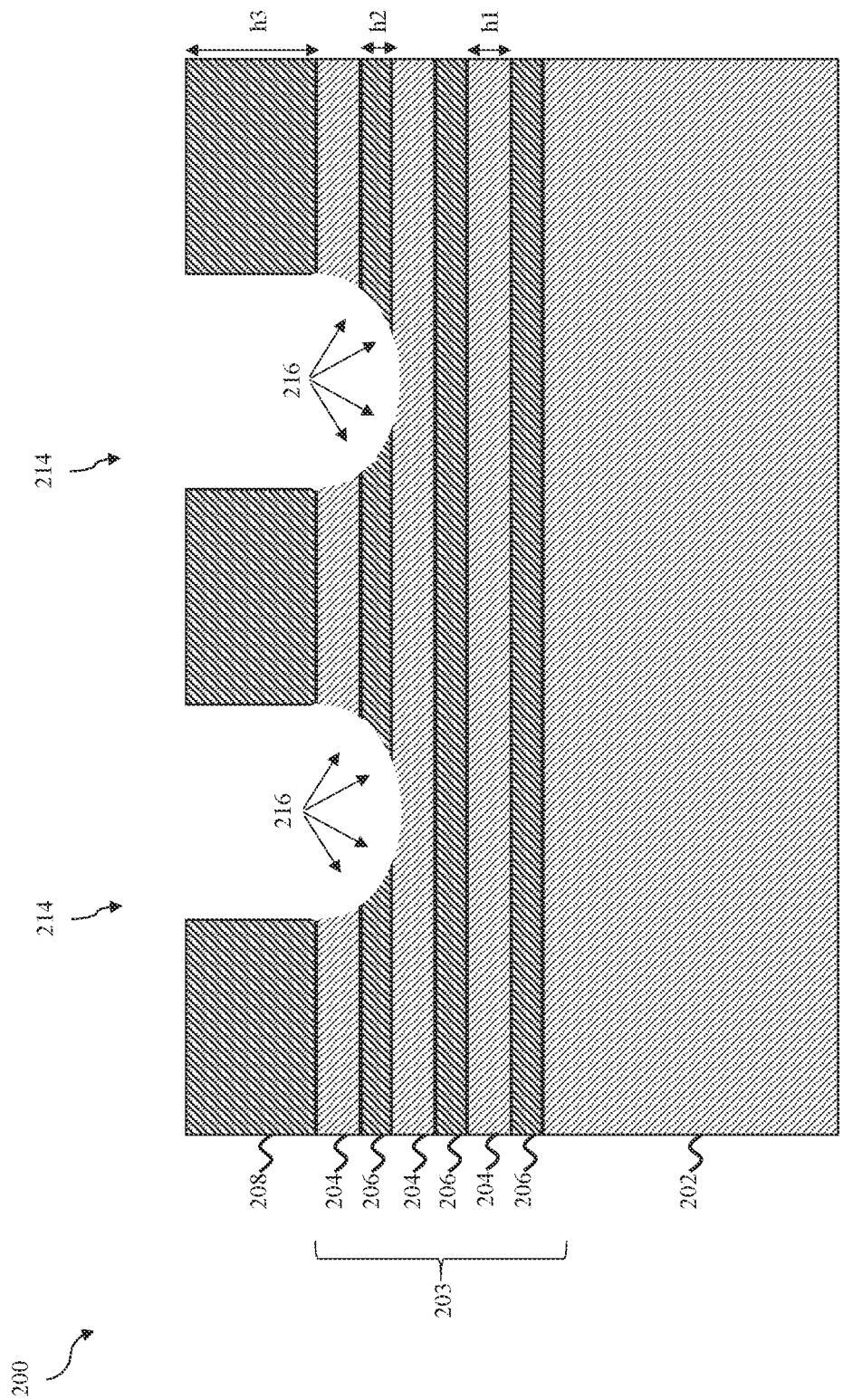

Referring to FIG. 4, at block 106 of method 100, a second etching process 216 is performed on device 200. The second etching process 216 is selected to complement the first etching process 212 to further etch trenches 214 in semiconductor layers 204 and 206. For example, the second etching process, including etchant and bias power, is selected for the second etching process 216 that etches the material of semiconductor layers 204 and 206 (e.g. silicon and silicon germanium) at a higher rate in the second direction than in the first direction. In some embodiments, the second etching process 216 further etches the sidewalls of trenches 214 and more specifically the bottom portions of the sidewalls of trenches 214 with minimal to no etching in the first direction. In the depicted embodiment, the second etching process 216 has a higher etch rate in the second direction than in the first direction.

In some embodiments, the second etching process 216 is a dry etching process. Various etching parameters can be tuned to achieve selective etching of semiconductor layers 204 and 206, such as etchant composition, etching temperature, etching solution concentration, etching time, etching pressure, source power, RF bias voltage, RF bias power, etchant flow rate, other suitable etching parameters, or combinations thereof. In some embodiments, the second etching process (such as an RIE process) utilizes a fluoride-containing gas (for example, $CHF_3$) to selectively etch semiconductor layers 204 and 206 in the second direction. In some embodiments, the fluoride-containing gas flow may be about 160 ml/min. In some embodiments, the second etching process utilizes sulfur hexafluoride ($SF_6$) with a flow rate of about 7 ml/min. The second etching process 216 lasts for a second duration. In some embodiments, the second duration is between about 1.3 to about 1.6 times greater than the first duration. In some embodiments, the second duration is between about 13 seconds and about 21 seconds. In some embodiments, the pressure is between about 5 mT to about 7 mT. In some embodiments, the source power is about 900 W. In some embodiments, the RF bias power is about 60 W and the RF frequency is about 1000 Hz.

At block 108 of method 100, a flush process may be performed. The flush process may be performed to clean away byproduct of the first etching process 212 and the second etching process 216. In some embodiments, the flush process at block 108 is not performed. In some embodiments, the flush process utilizes an oxygen containing gas (for example, $O_2$) to flush the byproduct of the first etching process 212 and the second etching process 216 from the trenches 214. In some embodiments, the oxygen-containing gas flow rate is about 200 ml/min. In some embodiments, the flush process utilizes sulfur dioxide ($SO_2$) with a flow rate of about 200 ml/in. In some embodiments, the source power is about 880 W. In some embodiments, the RF bias power is about 50 W and the pressure is about 10 mT.

At block 110 of method 100, the first etching process of block 104, the second etching process of block 106, and the flush process of block 108 are repeated. In some embodiments, the etching processes 104 and 106 and the flushing process 108 are repeated between four and six times. In some embodiments, the etching processes 104 and 106 and flushing process 108 are repeated more than 6 times. In some embodiments, the flush process 108 is not repeated. In some embodiments, the flush process 108 is omitted from one or more iterations of block 110. In the depicted embodiment, the first etching process 104 and the second etching process 106 are repeated twice for ease of description. However, it is understood that the etching processes may be repeated as many times as required to achieve the desired profile.

Figure 5:
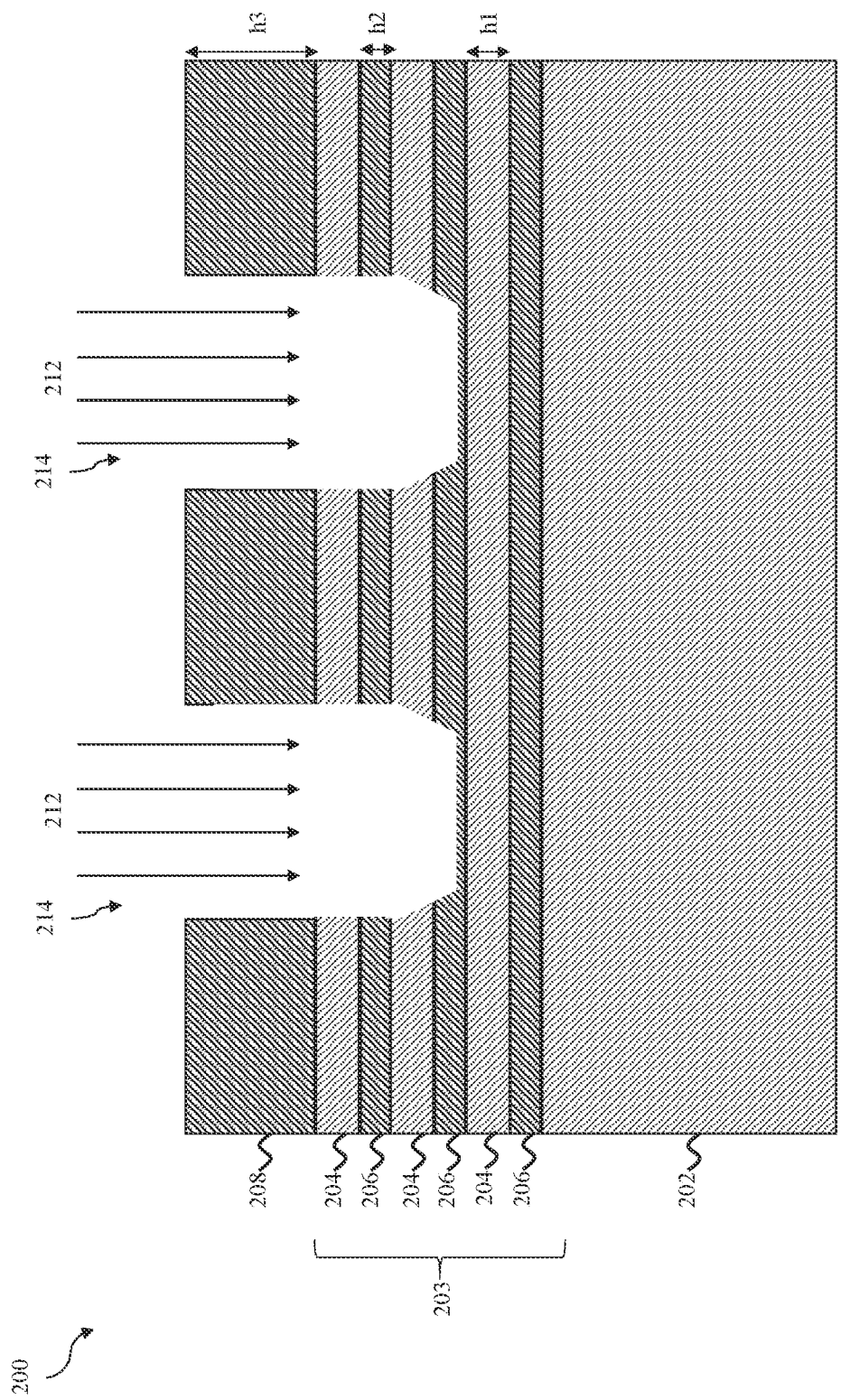

Referring to FIG. 5, the first etching process 212 is performed a second time, according to block 110 of method 100. As depicted, the first etching process 212 is similar to the first etching process 212 described above in FIG. 3. In some embodiments, the first etching process 212 etches through a second semiconductor layer 204 and partially in a second semiconductor layer 206, just below the second semiconductor layer 204. In the depicted embodiment, the first etching process 212 has a higher etch rate in the first direction than in the second direction. In some embodiments, each iteration of the first etching process 212 varies an etch parameter. For example, the duration of each first etching process 212 may be varied during each iteration block 104. In some embodiments, the first duration of each first etching process 212 may be shorter than the first duration of previous first etching process 212. In some embodiments, the duration of each first etching process 212 may be the same as the duration of the previous first etching process 212. In some embodiments, the duration of each first etching process 212 may be longer than the duration of the previous first etching process 212. In some embodiments, other process variables (e.g. etching gas) may be varied between each iteration of the first etching process 212. In some embodiments, each iteration of the first etching process 212 may be identical to the previous iteration of the first etching process 212.

Figure 6:
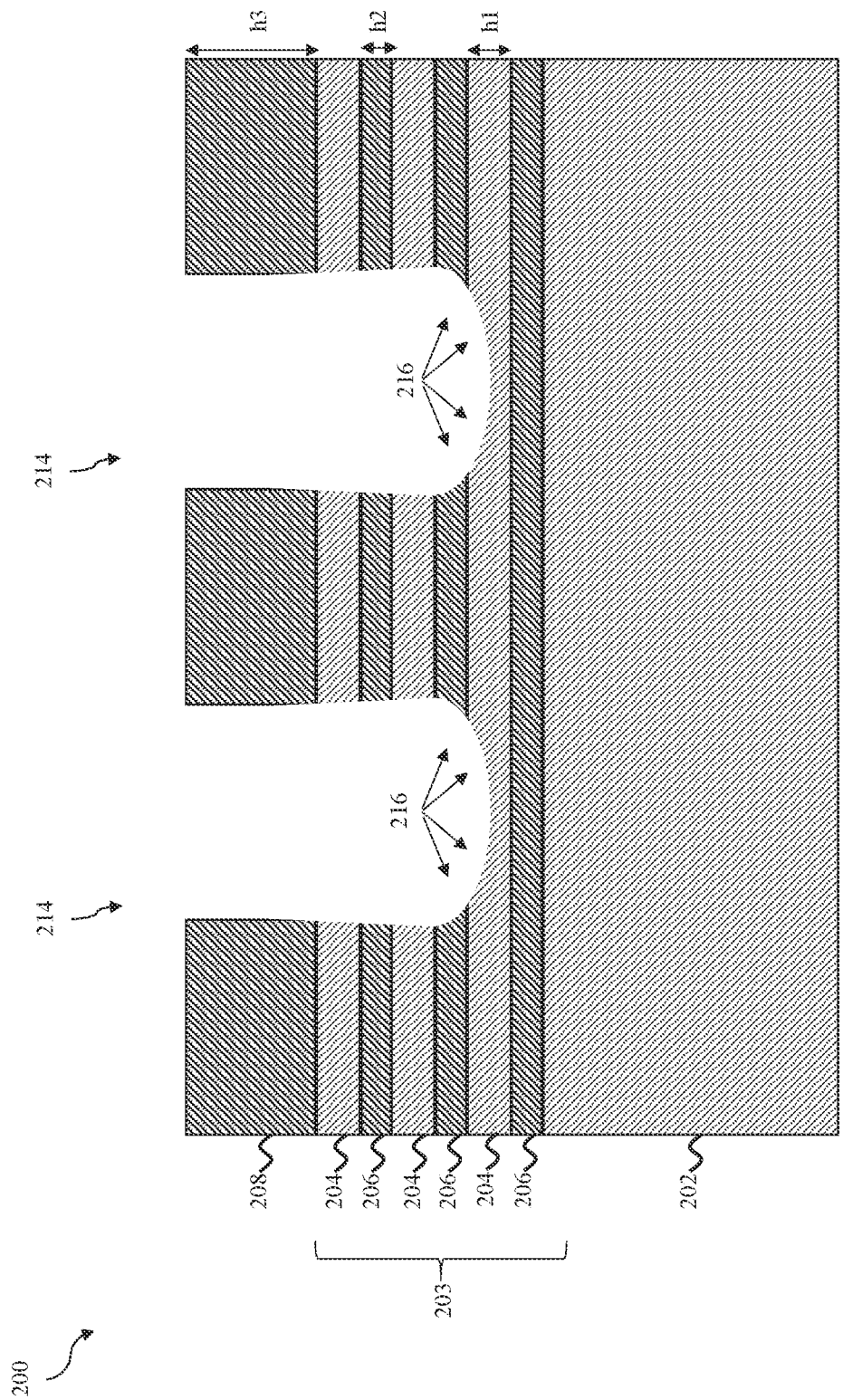

Referring to FIG. 6, the second etching process 216 is performed a second time, according to block 110 of method 100. As depicted, the second etching process 216 is similar to the second etching process 216 described above in FIG. 4. The second etching process 216 further etches trenches 214 in semiconductor layers 204 and 206. In some embodiments, the second etching process 216 further etches the sidewalls of trenches 214 and more specifically the bottom portions of the sidewalls of trenches 214 with minimal to no etching in the first direction. In the depicted embodiment, the second etching process 216 has a higher etch rate in the second direction than in the first direction. In some embodiments, each iteration of the second etching process 216 varies an etch parameter. For example, the duration of each second etching process 216 may be varied during each iteration block 106. In some embodiments, the duration of each second etching process 216 may be less than the duration of the previous second etching process 216. In some embodiments, the duration of each second etching process 216 may be the same as the duration of the previous second etching process 216. In some embodiments, the duration of each second etching process 216 may be longer than the duration of the previous second etching process 216. In some embodiments, other process variables (e.g. etching gas) may be varied between each iteration of the second etching process 216.

Figure 7:
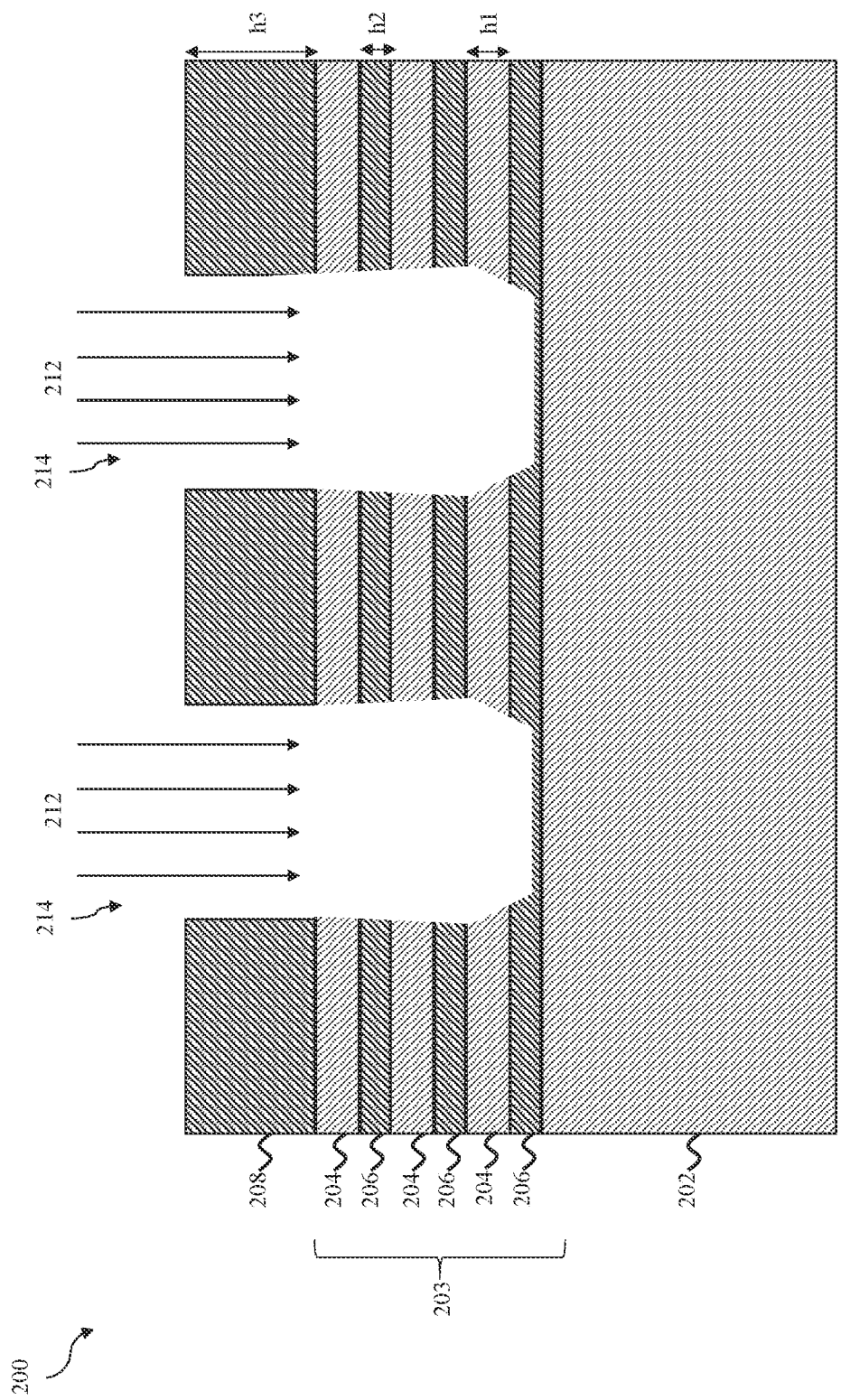

Referring to FIG. 7, the first etching process 212 is performed a third time, according to block 110 of method 100. As depicted, the third iteration of the first etching process 212 proceeds as described above in FIGS. 3 and 5. Trenches 214 are etched deeper. In the depicted embodiment, the first etching process 212 etches through a third semiconductor layer 204 and into a third semiconductor layer 206. In the depicted embodiment, the first etching process 212 has a higher etch rate in the first direction than in the second direction. The different etching parameter may be adjusted between each iteration of the first etching process 212 as described above in FIG. 5.

Figure 8:
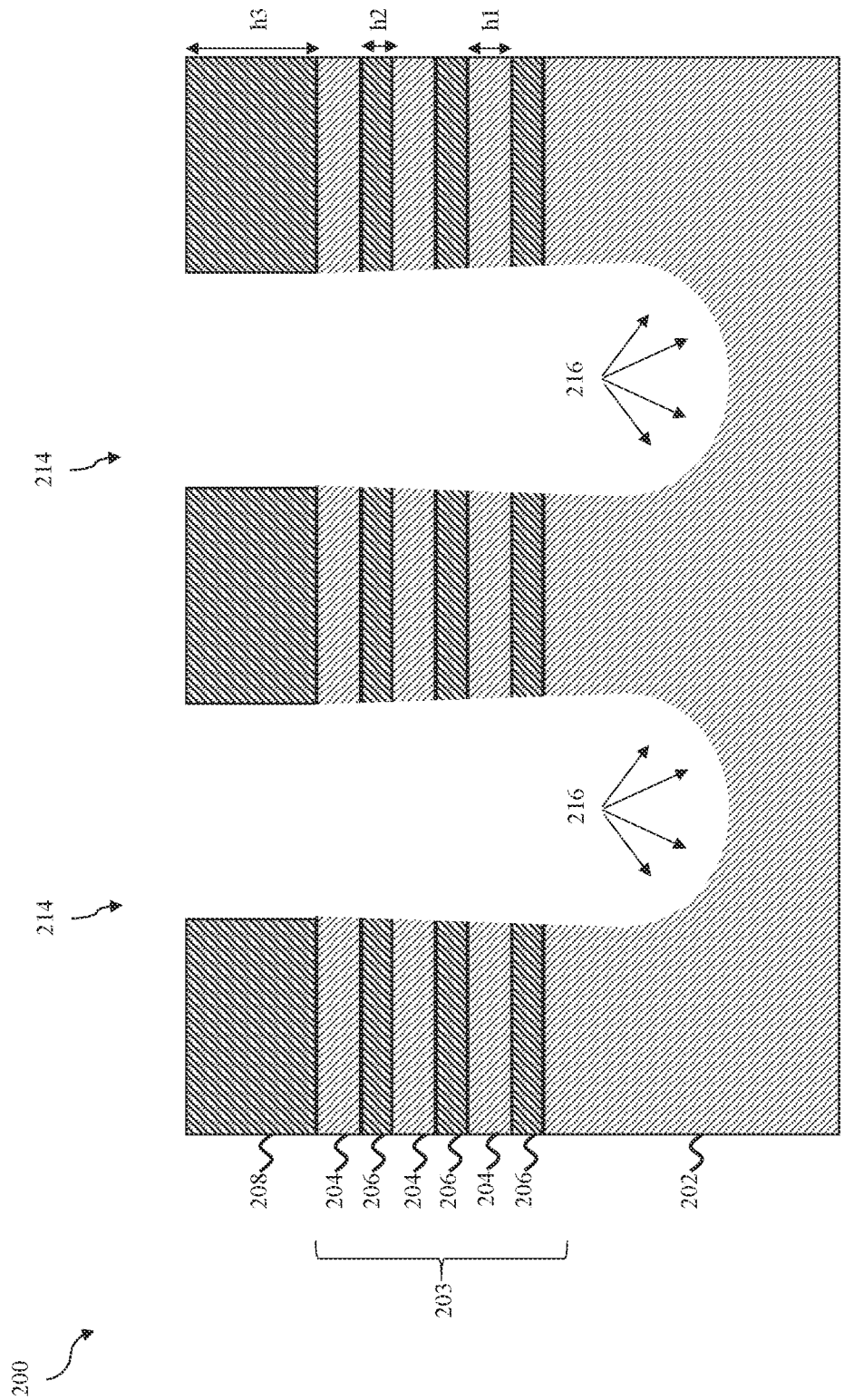

Referring to FIG. 8, the second etching process 216 is performed a third time, according to block 110 of method 100. As depicted, third iteration of the second etching process 216 proceeds as described above in FIGS. 4 and 6. The bottom surfaces of trenches 214 are further etched in the second direction. In the depicted embodiment, the second etching process 216 etches through the third semiconductor layer 206 in the first direction and into the substrate 202. Additionally, as depicted, the second etching process 2016 etches in the semiconductor material in the second direction to ensure that the width of the bottom surface of trenches 214 is greater than the width of the top surface of trenches 214.

Figure 9:
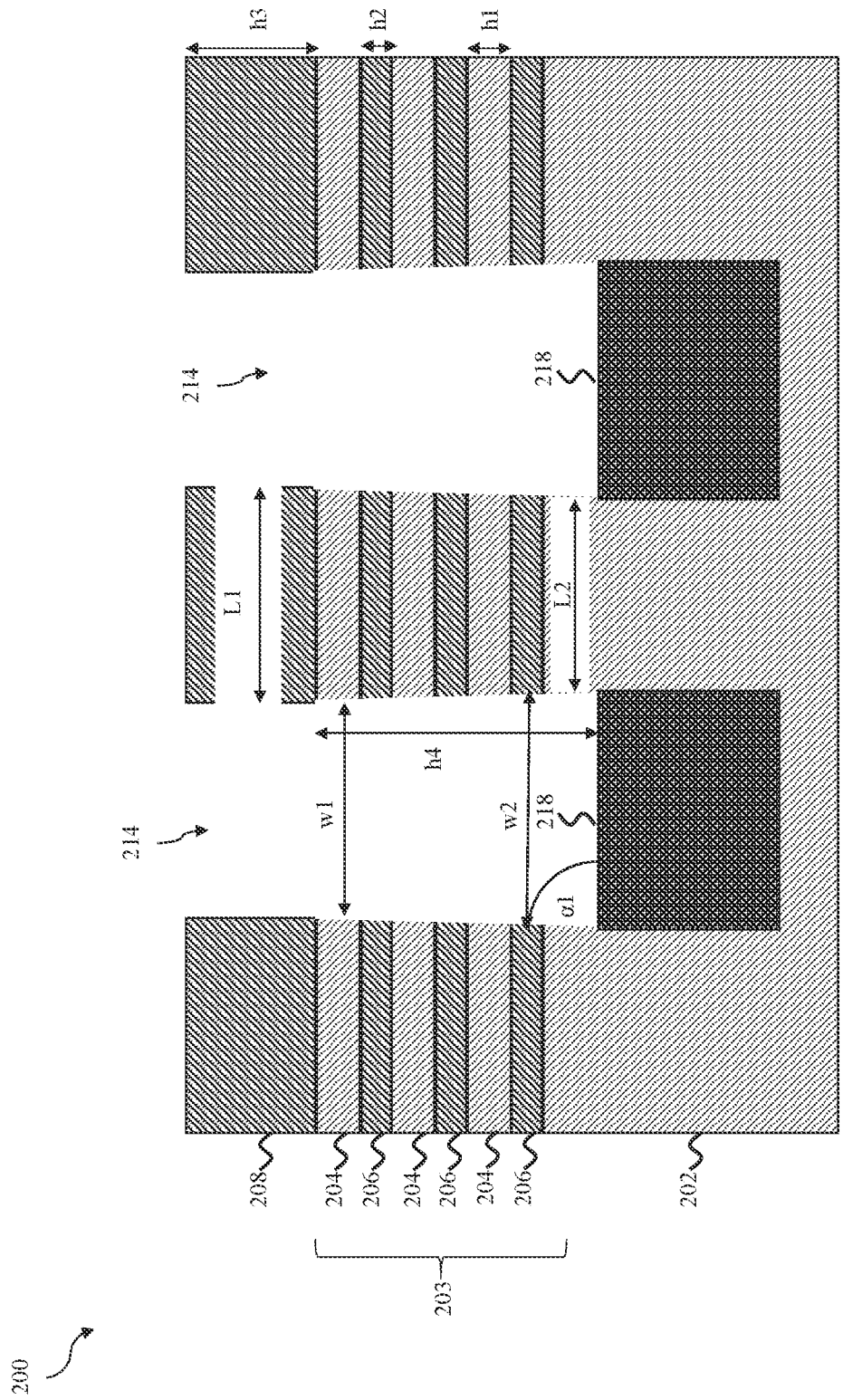

Referring to FIG. 9, at block 112 of method 100, a shallow trench isolation structure (STI) 218 is formed in trenches 214. In some embodiments, a top surface of the STI 218 is parallel with a top surface of the substrate 202. In the depicted embodiment, the top surface of the STI 218 is lower than the top surface of the substrate 202.

In some embodiments, the sidewalls of the trenches are not perfectly perpendicular to the top surface of substrate 202. That is, an angle α1 exists between the top surface of the substrate 202 and the sidewalls of trenches 214. In the depicted embodiment, angle α1 is about 87°, or about 3° from vertical. In some embodiments, angle α1 may be between about 85 degrees to about 87 degrees. Furthermore, the depicted embodiment shows a width w1 of a top portion of the trenches 214 that is less than a width w2 of a bottom portion of the trenches 214. In some embodiments, a difference between width w1 and width w2 may be between about 1 nm to about 5 nm. Conversely, a length L1 along the top surface of the topmost semiconductor layer 204 exists between the trenches 214 that is greater than a length L2 along a bottom surface of the bottom most semiconductor layer 206. The lengths L1 and L2 are measured in the second direction, the second direction being parallel to the top surface of substrate 202. In some embodiments, the length L1 is about 24 nm. In some embodiments, the length L2 is between about 18 nm and about 22 nm. A height h4 of the trenches 214 extends from the top surface of STI 218 to a top surface of a top layer of semiconductor layer stack 203 (e.g. the top surface of the top semiconductor layer 204). The height h4 is measured in the first direction, the first direction being perpendicular to the top surface of substrate 202. In some embodiments, the height h4 may be between about 40 nm and about 60 nm. By forming the trenches 214 this way the active regions of semiconductor material stacks 203 are formed having a necking profile. The necking profile of active regions of semiconductor material stacks 203 improves future processing steps. For example, a future processing step of etching a source/drain region using this necking profile ensures that no cladding residue will remain in the bottom of the source/drain region. This occurs because the top of the source/drain region is wider than the bottom of the source/drain region, ensuring that no other structures will obstruct the etching of the source/drain region.

Figure 10:
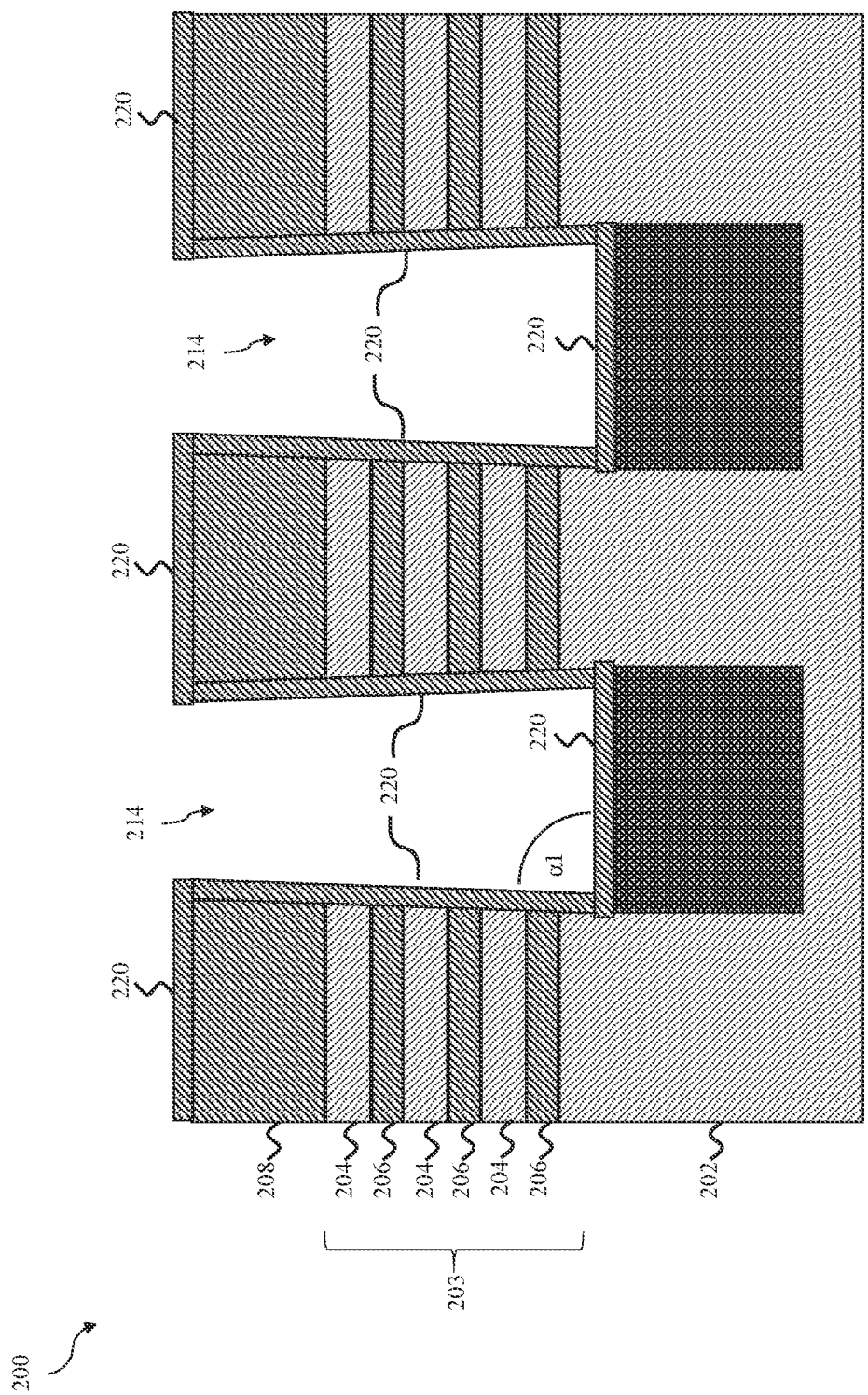

Referring to FIG. 10, at block 114 of method 100, a cladding (semiconductor) layer 220 is formed over the device 200 including on the sidewalls of the semiconductor layers 204,206 in the trenches 214, on the top surfaces of the hard mask layer 208, and on the top surface of the STI 218. In an embodiment, the cladding layer 220 includes SiGe. The cladding layer 220 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. An angle α2 exists between the top surface of the cladding layer 220 deposited on the top surface of the STI 218 and a sidewall surface of the cladding layer 220 deposited on a sidewall surface of semiconductor material stacks 203 (e.g. the semiconductor layers 204,206). In the depicted embodiment, angle α2 is about the same as angle α1.

Figure 11:
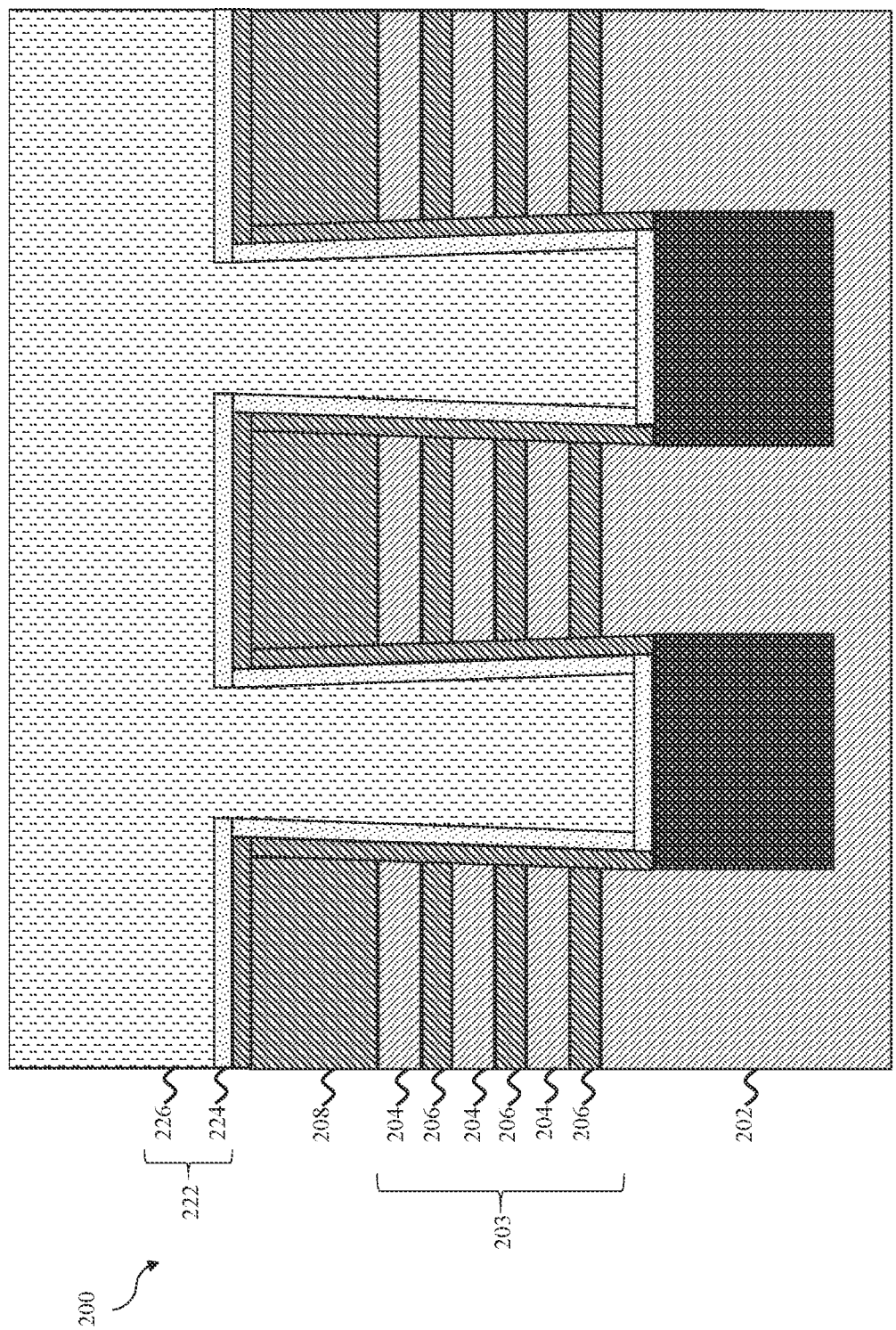

Referring to FIG. 11, at block 116 of method 100, dielectric fins 222 are formed over the semiconductor device 200 including over the hard mask layer 208 and in trenches 214, including over STI 218 and cladding layers 220. In some embodiments, before forming the dielectric fins 222, operation 116 performs an etching process to remove the portion of the cladding layer 220 from above the STI 218 and above the hard mask layer 208, for example, using a plasma dry etching process. In the depicted embodiment, the dielectric fins 222 include a dielectric liner 224 and a dielectric fill layer 226. The dielectric liner 224 is deposited over the cladding layer 220, on top surfaces of the STI 218, and on top surfaces of the hard mask layer 208, then a dielectric fill layer 226 is deposited over the dielectric liner 224 and fills the gaps between the semiconductor material stacks 203 and over the hard mask layer 208.

In an embodiment, the dielectric liner 224 includes silicon nitride or other suitable dielectric material. The dielectric liner 224 may be deposited using CVD, ALD other suitable methods, or combinations thereof. In an embodiment, the dielectric fill layer 226 includes silicon oxide, silicon nitride, silicon oxynitride, TEOS formed oxide, PSG, BPSG, low-k dielectric material, other suitable dielectric material, or combinations thereof. The dielectric fill layer 226 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 226 may be deposited using other types of methods.

Figure 12:
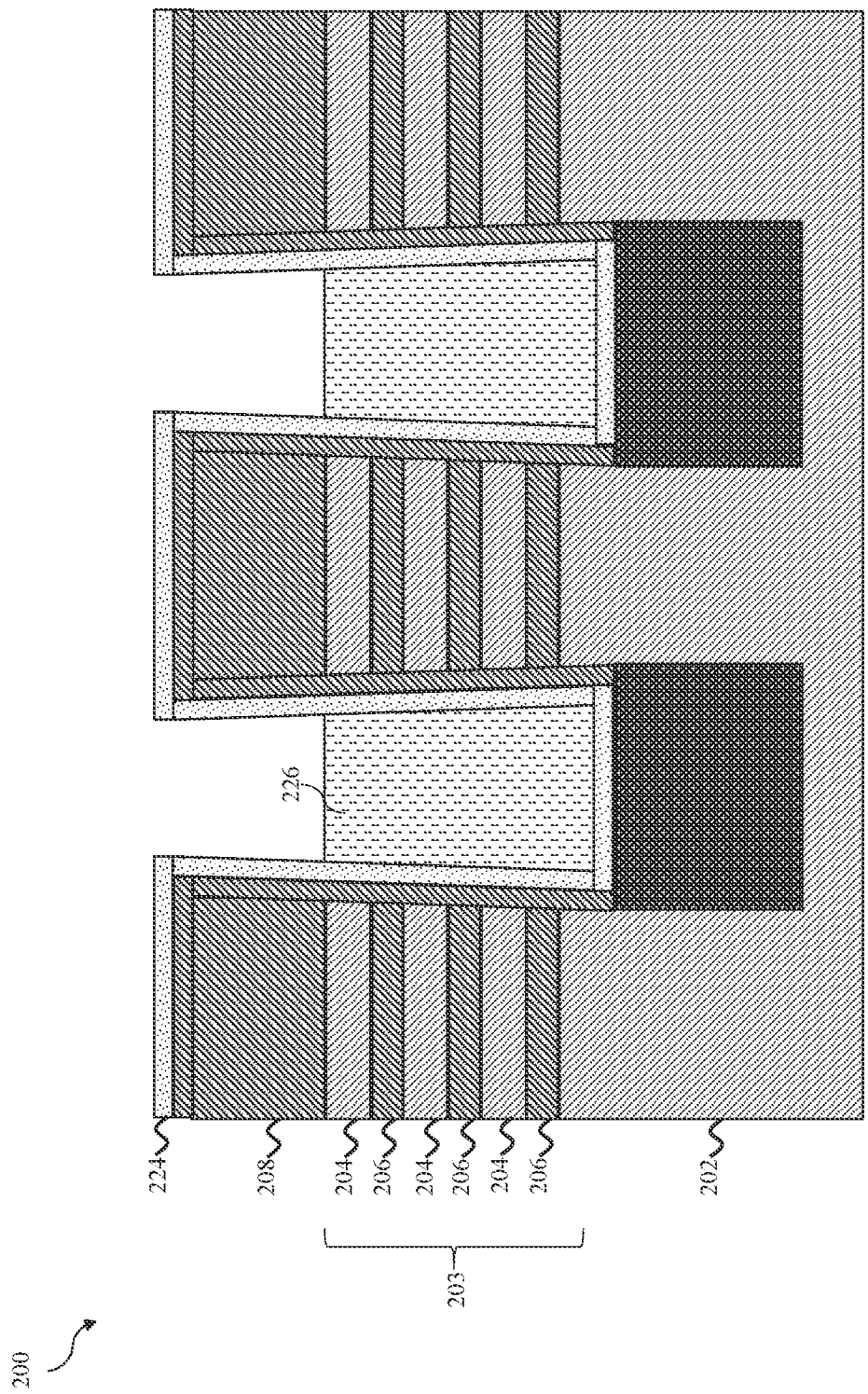

Referring to FIG. 12, continuing with block 116 of method 100, the dielectric fill layer 226 is recessed. In some embodiments, the dielectric fill layer 226 is recessed below a top surface of the hard mask layer 208. In some embodiments, an etching process is performed to recess the dielectric fill layer 226 with no (or minimal) etching of the dielectric line 224. In some embodiments, the etching process may be a plasma dry etching process. In other embodiments, any suitable etching process may be performed.

Figure 13:
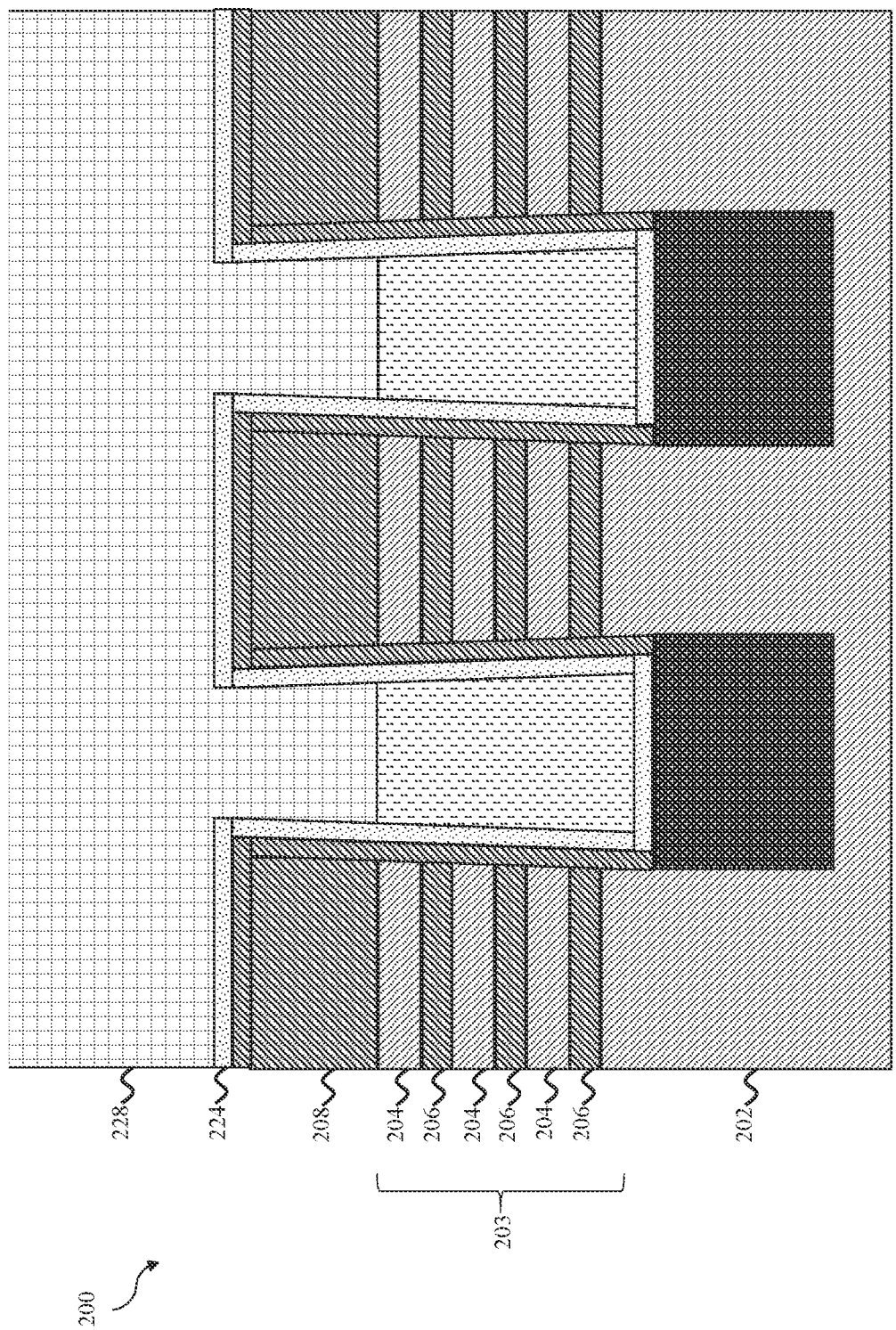

Referring to FIG. 13, at block 118, a high-k dielectric (HK) layer 228 is formed on dielectric fins 222, over the dielectric liner 224 and the dielectric fill layer 226, and between dielectric layers 224 on opposing sidewalls of the semiconductor material stacks 203. In an embodiment, the HK layer 228 includes a high-k dielectric material, such as $HfO_2$, $HfSiO$, $HfSiO_4$, $HfSiON$, $HfLaO$, $HfTaO$, $HfTiO$, $HfZrO$, $HfAlO_x$, $ZrO$, $ZrO_2$, $ZrSiO_2$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The HK layer 228 is formed by any of the processes described herein, such as ALD, CVD, PVD, oxidation-based deposition process, other suitable process, or combinations thereof. Then, the operation 118 deposits one or more dielectric materials into the recesses and performs a CMP process to the one or more dielectric materials to form the HK layer 228.

Figure 14:
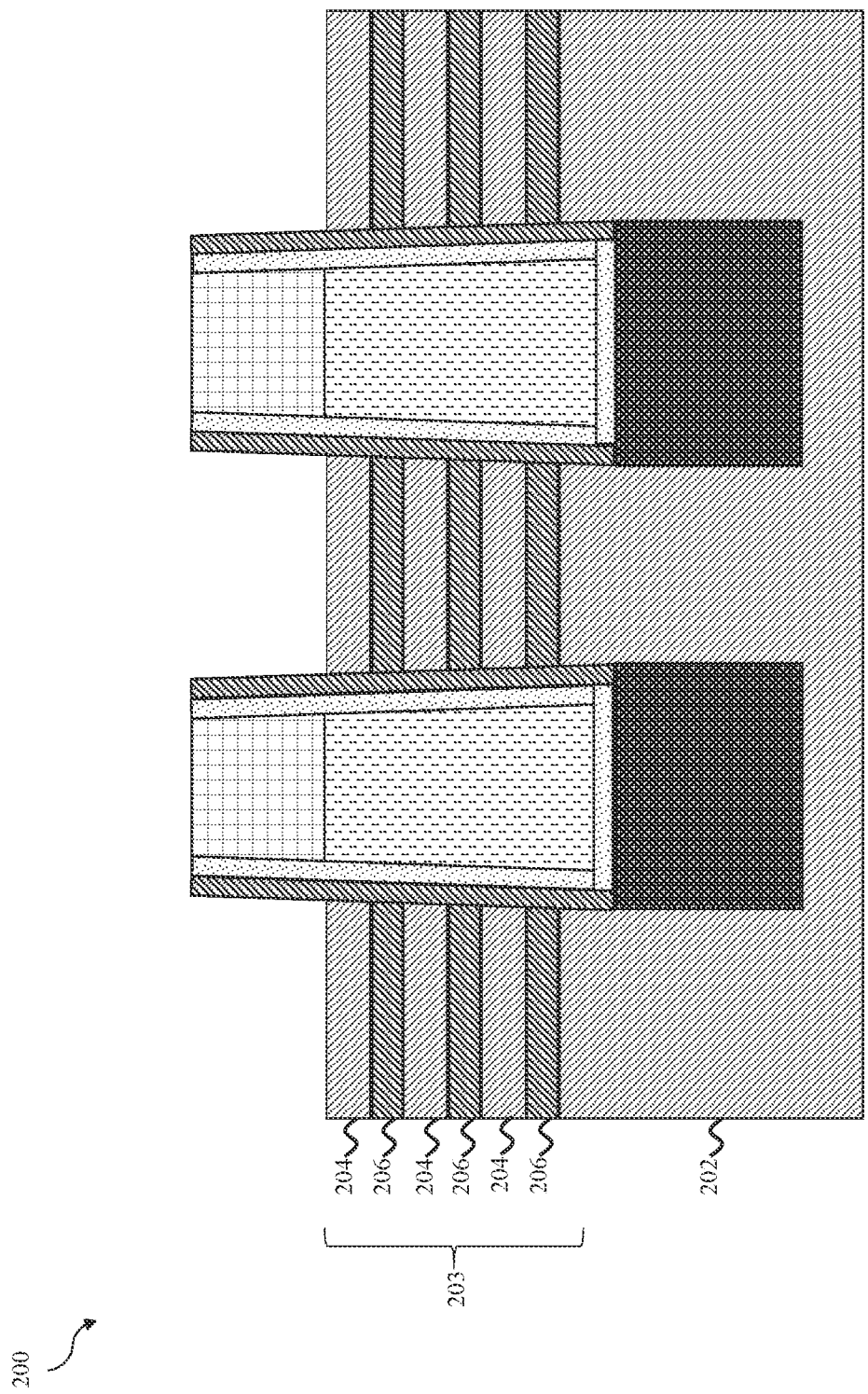

Referring to FIG. 14, at block 118 of method 100, the HK layer 228 is recessed and the hard mask layer 208 is removed with no (or minimal) etching of the top semiconductor layer, for example, the semiconductor layer 204. In some embodiments, the dielectric liner 224 and the cladding layer 220 that are disposed above the hard mask layer 208 are removed before removing the hard mask layer 208. The operation 118 may apply one or more etching processes that are selective to the hard mask layers 208, the dielectric line 224, and the cladding layer 220 and with no (or minimal) etching to the HK layer 228. The selective etching processes can be dry etching, wet drying, reactive ion etching, or other suitable etching methods.

Figure 15:
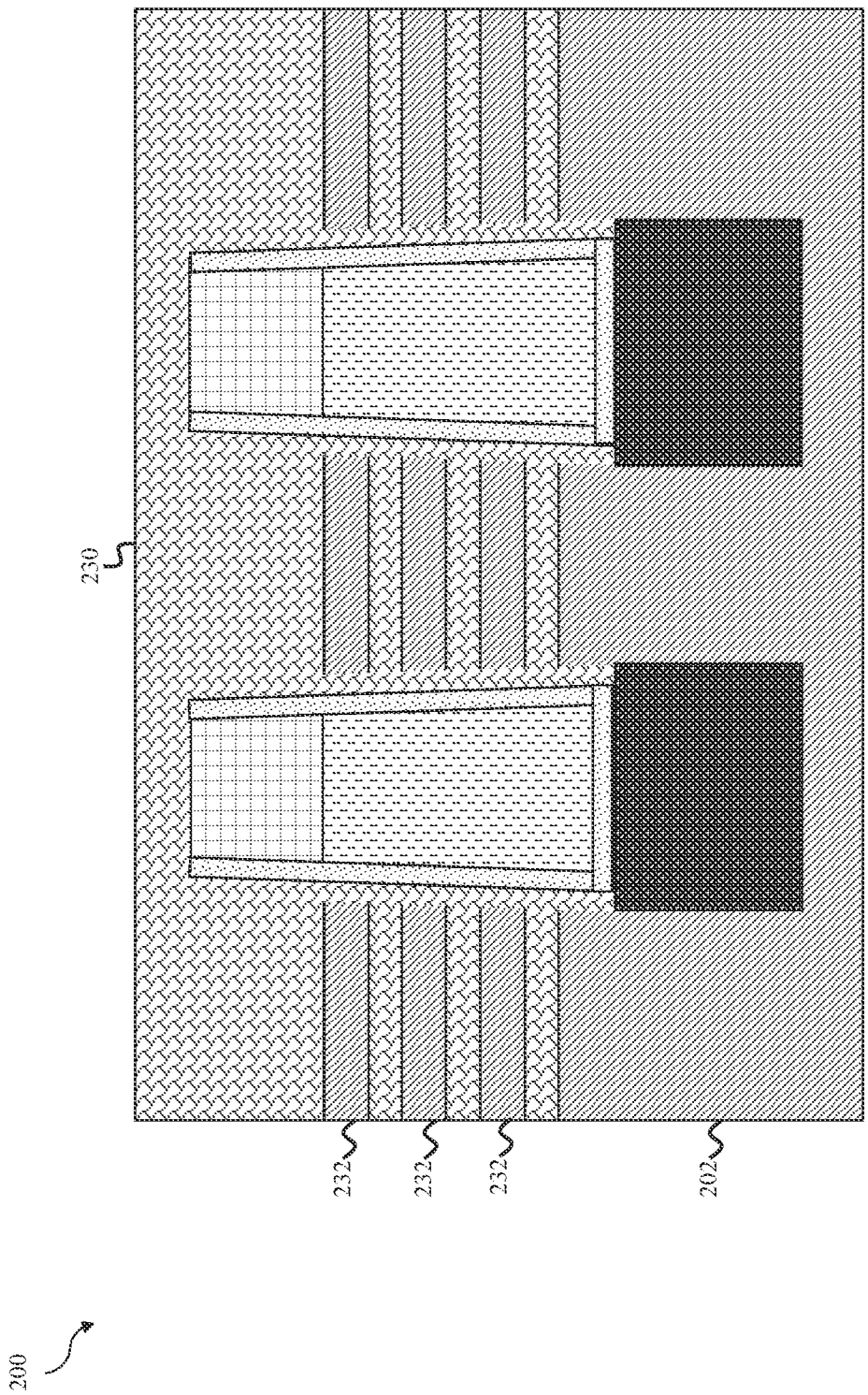

Referring to FIG. 15, at block 120 of method 100, dummy gate stacks, including a dummy gate electrode, and in some embodiments, a dummy gate dielectric, are formed over the device 200. The dummy gate electrode includes a suitable dummy gate material, such as a polysilicon layer. In embodiments where the dummy gate stacks include a dummy gate dielectric disposed between the dummy gate electrode and semiconductor material stack 203, the dummy gate dielectric includes a dielectric material, such as silicon oxide, a high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, or combinations thereof. In some embodiments, the dummy gate dielectric includes an interfacial layer (including, for example, silicon oxide) disposed over semiconductor material stack 203 and a high-k dielectric layer disposed over the interfacial layer. Dummy gate stacks can include numerous other layers, for example, capping layers, interface layers, diffusion layers, barrier layers, hard mask layers, or combinations thereof. For example, dummy gate stacks can further include a hard mask layer disposed over the dummy gate electrode.

Gate spacers are disposed adjacent to (i.e., along sidewalls of) respective dummy gate stacks. Gate spacers are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks and subsequently etched (e.g., anisotropically etched) to form gate spacers. In some embodiments, gate spacers include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks. In such implementations, the various sets of spacers can include materials having different etch rates. For example, a first dielectric layer including silicon and oxygen (e.g., silicon oxide) can be deposited and etched to form a first spacer set adjacent to dummy gate stacks, and a second dielectric layer including silicon and nitrogen (e.g., silicon nitride) can be deposited and etched to form a second spacer set adjacent to the first spacer set.

At block 122 of method 100, source/drain recesses are formed in source/drain regions of the device 200, for example, by an etching process. Source/drain recesses are formed by an etching process that completely removes a portion of semiconductor layers 204 and semiconductor layers 206 in source/drain regions of the device 200 and partially removes a portion of substrate 202 in source/drain regions of the device 200. After the source/drain etching process, source/drain recesses have sidewalls defined by remaining portions of semiconductor layers 204 and semiconductor layers 206. In some embodiments, the etching process removes some, but not all, of the portion of semiconductor layers 204 and semiconductor layers 206 in source/drain regions, such that source/drain recesses have a bottom defined by one of semiconductor layers 204 or semiconductor layers 206. In some embodiments, the etching process further removes some, but not all, of substrate 202, such that source/drain recesses extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor layers 204 and semiconductor layers 206. In some embodiments, parameters of the etching process are configured to selectively etch semiconductor layers 204 and semiconductor layers 206 with minimal (to no) etching of dummy gate stacks and gate spacers. In some embodiments, a lithography process, such as those described herein, is performed to form a patterned mask layer that covers dummy gate stacks and gate spacers and the etching process uses the patterned mask layer as an etch mask.

At block 124 of method 100, inner spacers are formed along sidewalls of semiconductor layers 206 by an inner spacer deposition and etch process. For example, a first etching process is performed that selectively etches semiconductor layers 206 exposed by source/drain recesses with minimal (to no) etching of semiconductor layers 204, such that gaps are formed between semiconductor layers 204 and between semiconductor layers 204 and substrate 202 under gate spacers. Portions (edges) of semiconductor layers 204 are thus suspended under gate spacers. In some embodiments, the gaps extend partially under dummy gate stacks. The first etching process is configured to laterally etch (e.g., along the y-direction) semiconductor layers 206, thereby reducing a length of semiconductor layers 206 along the y-direction. The first etching process is a dry etching process, a wet etching process, other suitable etching process, or combinations thereof. A deposition process then forms a spacer layer over dummy gate stacks, gate spacers, and over features defining source/drain recesses (e.g., semiconductor layers 204, semiconductor layers 206, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain recesses. The deposition process is configured to ensure that the spacer layer fills the gaps between semiconductor layers 204 and between semiconductor layers 204 and substrate 202 under gate spacers. A second etching process is then performed that selectively etches the spacer layer to form inner spacers with minimal (to no) etching of semiconductor layers 204, dummy gate stacks, and gate spacers. In some embodiments, the spacer layer is removed from sidewalls of gate spacers, sidewalls of semiconductor layers 204, dummy gate stacks, and substrate 202. The spacer layer (and thus inner spacers) includes a material that is different than a material of semiconductor layers 204 and a material of gate spacers to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

At block 126 of method 100, source/drain structures are epitaxially grown in the source/drain recess. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layers 204. The epitaxial layer may be doped with n-type dopants and/or p-type dopants. In some embodiments, for n-type GAA transistors, the epitaxial layer includes silicon. In such embodiments, the epitaxial layer can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type GAA transistors, the epitaxial layer includes silicon germanium or germanium. In such embodiments, the epitaxial layer can be doped with boron, other p-type dopant, or combinations thereof (for example, forming Si:Ge:B epitaxial source/drain features). In some embodiments, the epitaxial layer includes more than one epitaxial semiconductor layer, where the epitaxial semiconductor layers can include the same or different materials and/or dopant concentrations. In some embodiments, the epitaxial layer includes materials and/or dopants that achieve desired tensile stress and/or compressive stress in channel regions. In some embodiments, the epitaxial layer is doped during deposition by adding impurities to a source material of the epitaxy process (i.e., in-situ). In some embodiments, the epitaxial layer is doped by an ion implantation process subsequent to a deposition process. In some embodiments, annealing processes (e.g., rapid thermal annealing (RTA) and/or laser annealing) are performed to activate dopants in the epitaxial layer and/or other source/drain regions (for example, heavily doped source/drain regions and/or lightly doped source/drain (LDD) regions).

At block 128 of method 100, an inter-level dielectric (ILD) is formed over epitaxial source/drain features, dummy gates, and gate spacers, for example, by a deposition process (such as CVD, PVD, ALD, HDPCVD, MOCVD, RPCVD, PECVD, LPCVD, ALCVD, APCVD, plating, other suitable methods, or combinations thereof). In some embodiments, ILD layer is formed by a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The ILD layer includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. The ILD layer can include a multilayer structure having multiple dielectric materials. In some embodiments, a contact etch stop layer (CESL) is disposed between the ILD layer and the epitaxial layer and between the ILD layer and gate spacers. The CESL includes a material different than ILD layer, such as a dielectric material that is different than the dielectric material of ILD layer. For example, where ILD layer includes a low-k dielectric material, the CESL includes silicon and nitrogen, such as silicon nitride or silicon oxynitride. Subsequent to the deposition of ILD layer and/or the CESL, a CMP process and/or other planarization process can be performed until reaching (exposing) a top portion (or top surface) of dummy gate stacks. In some embodiments, the planarization process removes hard mask layers to expose underlying dummy gate electrodes of dummy gate stacks, such as polysilicon gate electrode layers.

ILD layer may be a portion of a multilayer interconnect (MLI) feature disposed over substrate 202. The MLI feature electrically couples various devices (for example, p-type GAA transistors and/or n-type GAA transistors of the device 200, transistors, resistors, capacitors, and/or inductors) and/or components (for example, gate structures and/or epitaxial source/drain features of the device 200), such that the various devices and/or components can operate as specified by design requirements of the device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of the device 200 and/or distribute signals (for example, clock signals, voltage signals, and/or ground signals) to the devices and/or the components of the device 200.

At block 130 of method 100, the dummy gate stacks are removed to form gate trenches. Semiconductor layers 206 and cladding layer 220 exposed by the gate trenches are then selectively removed from the channel regions of the device 200, thereby leaving suspended semiconductor layers 204 as channel layers 232. In the depicted embodiment, removing semiconductor layers 206 and cladding layer 220 provides three channel layers 232 through which current will flow between respective epitaxial source/drain features during operation of the device 200. In some embodiments, this process may be referred to as a channel nanowire release process, where each channel layer 232 has nanometer-sized dimensions and can be referred to as a nanowire. "Nanowire" generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, after removing semiconductor layers 206 and cladding layer 220, an etching process is performed to modify a profile of channel layers 232 to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 232 (nanowires) have sub-nanometer dimensions depending on design requirements of the device 200.

In some embodiments, an etching process selectively etches semiconductor layers 206 and cladding layer 220 with minimal (to no) etching of semiconductor layers 204 and, in some embodiments, minimal (to no) etching of gate spacers and/or inner spacers. Various etching parameters can be tuned to achieve selective etching of semiconductor layers 206 and cladding layer 220, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 206 and cladding layers 220 (e.g., silicon germanium) at a higher rate than the material of semiconductor layers 204 (e.g., silicon) (i.e., the etchant has a high etch selectivity with respect to the material of semiconductor layers 206). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 206. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 206. In some embodiments, a chemical vapor phase etching process using hydrochloric acid (HCl) selectively etches semiconductor layers 206.

Metal gate stacks 230, which include a gate dielectric (for example, a gate dielectric layer) and a gate electrode (for example, a work function layer and a bulk conductive layer), are then formed in the gate trenches. In FIG. 15, metal gate stacks 230 wrap (surround) channel layers 232, where gate dielectric is disposed between gate electrode and channel layers 204. Metal gate stacks may include numerous other layers, for example, capping layers, interface layers, diffusion layers, barrier layers, hard mask layers, or combinations thereof. In the depicted embodiment, gate dielectric includes a high-k dielectric layer, which includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k dielectric layer is formed by any of the processes described herein, such as ALD, CVD, PVD, oxidation-based deposition process, other suitable process, or combinations thereof. In some embodiments, gate dielectric includes an interfacial layer disposed between the high-k dielectric layer and channel layers 232.

Gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer is an n-type work function layer and includes any suitable work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the work function layer includes a p-type work function material such as Ru, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The work function layer and/or the conductive bulk layer are formed by any of the processes described herein, such as ALD, CVD, PVD, plating, other deposition process, or combinations thereof.

Although not intended to be limiting, one or more embodiments of the present disclosure provide many benefits to a semiconductor device and a formation process thereof. For example, embodiments of the present disclosure provide a semiconductor device comprising a semiconductor material stack formed between a pair of dielectric fins. The semiconductor material stack being larger along its top surface than along its bottom surface, along the substrate. No portion of the dielectric fins are vertically over any portion of the semiconductor material stack. Thus, the performance of future processing steps can be improved.

The present disclosure provides for many different embodiments. An exemplary method comprises receiving a substrate including a semiconductor material stack formed thereon. The semiconductor material stack includes a first semiconductor layer of a first semiconductor material and a second semiconductor layer of a second semiconductor material that is different than the first semiconductor material. The method further includes patterning the semiconductor material stack to form a trench. The patterning includes performing a first etch process with a first etchant and a first etch duration. In some embodiments, the first etchant includes a chlorine-containing chemical. The patterning further includes performing a second etch process with a second etchant and a second etch duration where the second etchant is different than the first etchant and the second etch duration is greater than the first etch duration. In some embodiments, the second etchant includes a fluorine-containing chemical. In some embodiments, the second etch duration is between about 1.3 to about 1.6 times greater than the first etch duration. The patterning further includes repeating the first etch process and the second etch process a predetermined number of times. The method further includes epitaxially growing a third semiconductor layer of the first semiconductor material on a sidewall of the trench.

In some embodiments, the method further comprises a performing a flush process after performing the second etch process. In some embodiments, the flush process includes $SO_2/O_2$. In some embodiments, the method further comprises decreasing the first etch duration each time the first etch process is repeated and increasing the second etch dura Another exemplary method comprises providing a semiconductor layer stack over a substrate. The semiconductor layer stack includes a first semiconductor material layer and a second semiconductor material layer in an interleaving fashion. The method further comprises etching the semiconductor layer stack as part of a first etching process. In some embodiments, the first etching process includes a chlorine-containing etchant. The method further comprises etching the semiconductor layer stack as part of a second etching process where the second etching process has a lateral etch rate greater than that of the first etching process and the second etching process is longer than the first etching process. In some embodiments, the second etching process includes a fluorine-containing etchant. In some embodiments, the second etching process is between about 1.3 to about 1.6 times longer than the first etching process. The method further comprises, repeating the first etching process and the second etching process. In some embodiments, the first etching process and the second etching process are repeated 4 to 6 times. The method further comprises, epitaxially growing a third semiconductor layer on a sidewall of the semiconductor layer stack. The method further comprises forming a dielectric fin adjacent the third semiconductor layer.

In some embodiments, the method further comprises flushing a byproduct from the semiconductor layer stack after etching the semiconductor layer stack as part of the second etching process and repeating the flushing after each repetition of the second etching process. In some embodiments, the flushing of the byproduct includes using $SO_2/O_2$ for the flushing.

An exemplary device comprises a substrate and a plurality of channels of a semiconductor material vertically stacked on the substrate. In some embodiments, the plurality of channels of the semiconductor material include Si. In some embodiments, the topmost channel of the plurality of semiconductor channels spans about 24 nm. The device further comprises a gate stack disposed on the plurality of channels and extended to wrap around each of the plurality of channels where the plurality of channels span dimensions different from each other such that each one of the plurality of channels spans a dimension greater than that of any one of the plurality of channels below.

In some embodiments, the device further comprises a dielectric fin disposed adjacent the plurality of channels of the semiconductor material. In some embodiments, the device further comprises a shallow trench isolation structure disposed under the dielectric fin. In some embodiments, a first distance in a first direction of a top portion of the dielectric fin is less than a second distance in the first direction of a bottom portion of the dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a substrate including a semiconductor material stack formed thereon, wherein the semiconductor material stack includes a first semiconductor layer of a first semiconductor material and second semiconductor layer of a second semiconductor material that is different than the first semiconductor material;
   patterning the semiconductor material stack to form a trench, wherein the patterning includes:
     performing a first etch process with a first etchant and a first etch duration;
     performing a second etch process with a second etchant and a second etch duration, wherein the second etchant is different from the first etchant and the second etch duration is greater than the first etch duration;
     repeating the first etch process and the second etch process a predetermined number of times; and
   epitaxially growing a third semiconductor layer of the first semiconductor material on a sidewall of the trench.

2. The method of claim 1, wherein the first etchant includes a chlorine-containing chemical.

3. The method of claim 1, wherein the second etchant includes a fluorine-containing chemical.

4. The method of claim 1, wherein the second etch duration is between about 1.3 to about 1.6 times greater than the first etch duration.

5. The method of claim 1, further comprising performing a flush process after the performing the second etch process.

6. The method of claim 5, wherein the flush process includes $SO_2/O_2$.

7. The method of claim 1, further comprises:
decreasing the first etch duration each time the first etch process is repeated; and
increasing the second etch duration each time the second etch process is repeated.

8. A method comprising:
providing a semiconductor layer stack over a substrate, the semiconductor layer stack including a first semiconductor material layer and a second semiconductor material layer in an interleaving fashion;
etching the semiconductor layer stack as part of a first etching process;
etching the semiconductor layer stack as part of a second etching process, wherein the second etching process has a lateral etch rate greater than that of the first etching process, and
wherein the second etching process is longer than the first etching process; and
repeating the first etching process and the second etching process;
epitaxially growing a third semiconductor layer on a sidewall of the semiconductor layer stack; and
forming a dielectric fin adjacent the third semiconductor layer.

9. The method of claim 8, wherein the first etching process includes a chlorine-containing etchant.

10. The method of claim 8, wherein the second etching process includes a fluorine-containing etchant.

11. The method of claim 8, wherein the second etching process is between about 1.3 to about 1.6 times longer than the first etching process.

12. The method of claim 8, further comprising:
flushing a byproduct from the semiconductor layer stack after etching the semiconductor layer stack as part of the second etching process; and
repeating the flushing after each repetition of the second etching process.

13. The method of claim 12, wherein the flushing of the byproduct includes using $SO_2/O_2$ for the flushing.

14. The method of claim 8, wherein the first etching process and the second etching process are repeated 4 to 6 times.

15. A semiconductor structure, comprising:
a substrate;
a plurality of channels of a semiconductor material vertically stacked on the substrate;
a gate stack disposed on the plurality of channels and extended to wrap around each of the plurality of channels, wherein the gate stack includes a gate dielectric layer and a gate electrode, wherein the plurality of channels span dimensions different from each other such that each one of the plurality of channels spans a dimension greater than that of any one of the plurality of channels below; and
a dielectric fin disposed adjacent the plurality of channels of the semiconductor material, wherein the dielectric fin includes a top portion having a high-k dielectric and a bottom portion having a dielectric fill layer.

16. The semiconductor structure of claim 15, further comprising a shallow trench isolation structure disposed under the dielectric fin.

17. The semiconductor structure of claim 15, wherein a first distance in a first direction of the top portion of the dielectric fin is less than a second distance in the first direction of the bottom portion of the dielectric fin.

18. The semiconductor structure of claim 15, wherein the plurality of channels of the semiconductor material include Si.

19. The semiconductor structure of claim 15, wherein a topmost channel of the plurality of channels of the semiconductor channels spans about 24 nm.

20. The semiconductor structure of claim 15, further comprising a dielectric liner surrounding side surfaces of the dielectric fin.

* * * * *